(12) United States Patent
Tseng et al.

(10) Patent No.: US 7,687,757 B1
(45) Date of Patent: Mar. 30, 2010

(54) DESIGN OF MICROLENS ON PIXEL ARRAY

(75) Inventors: Chi-Xiang Tseng, Hsinchu (TW);
Chin-Poh Pang, Hsinchu (TW);
Cheng-Lin Yang, Hsinchu (TW);
Wu-Chieh Liu, Keelung (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 12/362,241

(22) Filed: Jan. 29, 2009

(51) Int. Cl.
*H01L 27/00* (2006.01)

(52) U.S. Cl. ............. 250/208.1; 250/214.1; 250/214 R; 257/290

(58) Field of Classification Search ............... 250/208.1, 250/214.1, 214 R; 257/290–294
See application file for complete search history.

(56) References Cited

U.S. PATENT DOCUMENTS 7,427,742 B2 * 9/2008 Drowley et al. ............. 250/216

2007/0030379 A1 * 2/2007 Agranov ..................... 348/340
2008/0011936 A1 * 1/2008 Kuo et al. ................. 250/208.1
2009/0045322 A1 * 2/2009 Campbell et al. ........ 250/208.1

* cited by examiner

*Primary Examiner*—Seung C Sohn
(74) *Attorney, Agent, or Firm*—Muncy, Geissler, Olds & Lowe, PLLC

(57) ABSTRACT

A method for designing a microlens array on a pixel array is disclosed. A radial distance of each pixel from a central pixel in a pixel array is calculated, in which the central pixel acts as an origin of an X-Y coordinate. A chief ray angle of each pixel is determined according to the corresponding radial distance. A microlens shift with respect to the corresponding pixel is determined according to the corresponding chief ray angle. Each microlens shift combines an X-axis direction shift with a Y-axis direction shift, and the X-axis direction shift ratio is different from the Y-axis direction shift ratio. A plurality of microlenses is arranged according to the corresponding microlens shifts to form a microlens array on the pixel array.

11 Claims, 5 Drawing Sheets

DESIGN OF MICROLENS ON PIXEL ARRAY

BACKGROUND OF THE INVENTION

1. Field of the Invention

The invention relates to an image sensor device with a shifted microlens array and more particularly to a microlens shift calculation for the microlens array.

2. Description of the Related Art

As optoelectronic applications, such as digital cameras, digital video recorders, image capture capable mobile phones and monitors, become more and more popular, the demand for image sensor devices accordingly increase. An image sensor device is used for recording a change of a photo signal from an image and converting the photo signal into an electronic signal. After recording and processing the electronic signal, a digital image is generated. In general, image sensor devices can be categorized into two main types, one is charge coupled devices (CCD) and the other complementary metal oxide semiconductor (CMOS) devices.

The image sensor device typically comprises a pixel array. Each pixel includes a photosensor that produces a signal corresponding to the intensity of light impinging on the photosensor. When an image is focused on the array, signals can be employed to display a corresponding image. In conventional technology, a microlens array is correspondingly disposed above the pixel array and used for focusing light onto the pixel array. However, despite the use of the microlens array, a large amount of incident light is not directed efficiently onto the photosensors due to the geometry of the pixel array. Different pixels of the pixel array may receive light with different chief ray angles (CRA), depending on the pixel location in the pixel array. For example, a central pixel of the pixel array may receive light with a chief ray angle of 0 degrees and peripheral pixels of the pixel array may receive light with chief ray angles up to about 25 to 30 degrees. Thus, both the intensity and the focal depth of the incident light to each pixel/photosensor are varied as the chief ray angle varies. The varied light intensities and focal depths may enhance shading effect and cross-talk of pixels, resulting in reduction of the signal to noise ratio (SNR) and photosensitivity of the image sensor device.

Therefore, there is a need to develop a novel design for a microlens array capable of enhancing coupling efficiency of pixels and reducing cross-talk of pixels.

BRIEF SUMMARY OF THE INVENTION

A detailed description is given in the following embodiments with reference to the accompanying drawings. A method for designing a microlens array on a pixel array and an image sensor device are provided. An embodiment of a method for designing a microlens array on a pixel array comprises calculating a radial distance of each pixel from a central pixel in a pixel array, in which the central pixel acts as an origin of an X-Y coordinate. A chief ray angle of each pixel is determined according to the corresponding radial distance. A microlens shift with respect to the corresponding pixel is determined according to the corresponding chief ray angle. Each microlens shift combines an X-axis direction shift with a Y-axis direction shift, and an X-axis direction shift ratio is different from a Y-axis direction shift ratio. A plurality of microlenses is arranged according to the corresponding microlens shifts to form a microlens array on the pixel array. The X-axis direction shift ratio is a ratio of the X-axis direction shift to a distance between the shifted microlens and the origin along the X-axis direction, and the Y-axis direction shift ratio is a ratio of the Y-axis direction shift to a distance between the shifted microlens and the origin along the Y-axis direction.

An embodiment of an image sensor device comprises a pixel array having a plurality of pixels. A microlens array has a plurality of microlenses correspondingly associated with the plurality of pixels, wherein each microlens is shifted with respect to the corresponding pixel by a distance except for the microlens corresponding to a central pixel of the pixel array. The distance is determined by the steps of: calculating a radial distance of each pixel from a central pixel in a pixel array, in which the central pixel acts as an origin of an X-Y coordinate; determining a chief ray angle of each pixel according to the corresponding radial distance; determining a microlens shift with respect to the corresponding pixel according to the corresponding chief ray angle; and arranging a plurality of microlenses according to the corresponding microlens shifts to form a microlens array on the pixel array. Each microlens shift combines an X-axis direction shift with a Y-axis direction shift, and an X-axis direction shift ratio is different from a Y-axis direction shift ratio. The X-axis direction shift ratio is a ratio of the X-axis direction shift to a distance between the shifted microlens and the origin along the X-axis direction, and the Y-axis direction shift ratio is a ratio of the Y-axis direction shift to a distance between the shifted microlens and the origin along the Y-axis direction.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
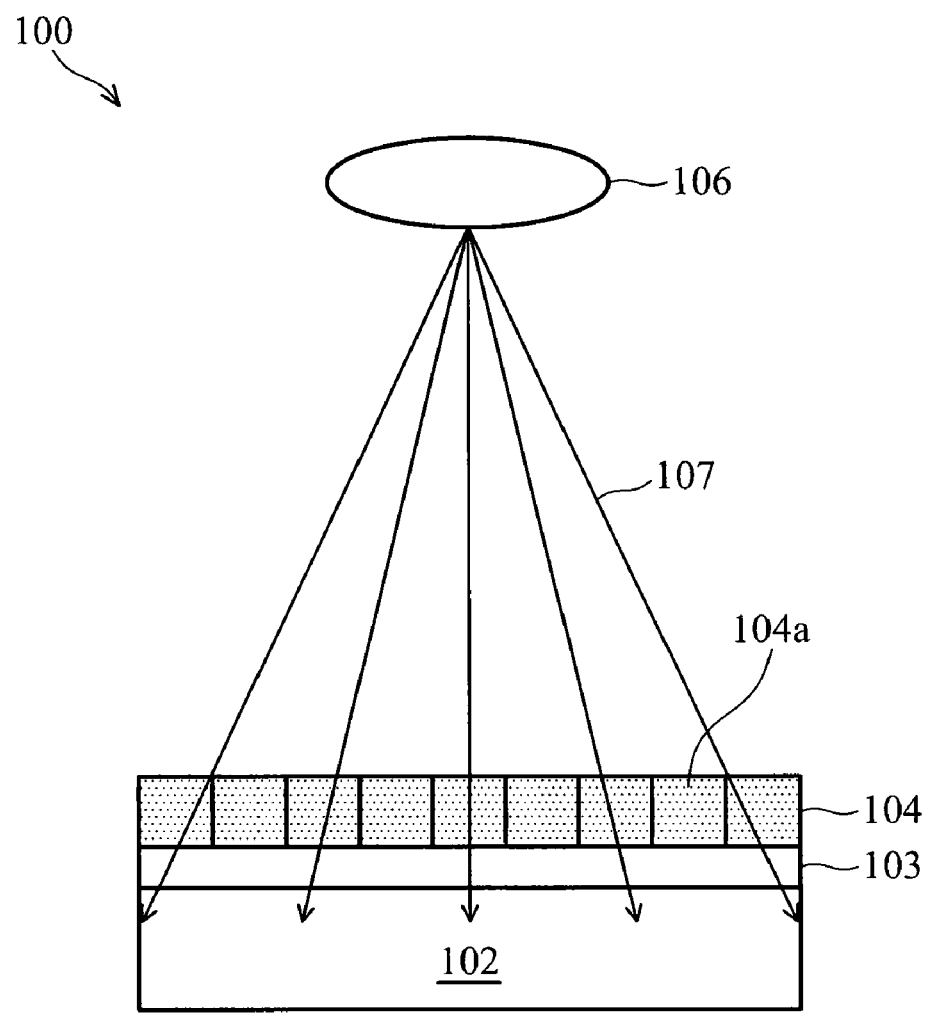
FIG. 1 is a cross section of an exemplary embodiment of an image sensor device according to the invention.

Referring to FIG. 1, which is an exemplary embodiment of an image sensor device. The image sensor device comprises a substrate having a pixel array 102 therein, an intervening layer 103, a microlens array 104, and an image lens 106. The pixel array 102 includes a plurality of pixels (not shown) and each pixel may include a photosensor for converting a photo signal from an incident light 107 provided by the image lens 106 into an electronic signal. The intervening layer 103 disposed on the pixel array 102 may be composed of a multilayered structure comprising, for example, an interlayer dielectric (ILD) layer and an intermetal dielectric (IMD) layer for metallization. Moreover, the multilayered structure may further comprise a color filter array and an overlying passivation or planarization layer for protection thereof. In order to simplify the diagram, only a flat layer 103 is depicted. The microlens array 104 is disposed on the intervening layer 103. The microlens array 104 includes a plurality of microlenses 104a correspondingly associated with the plurality of pixels in the pixel array 102.

Figure 6:
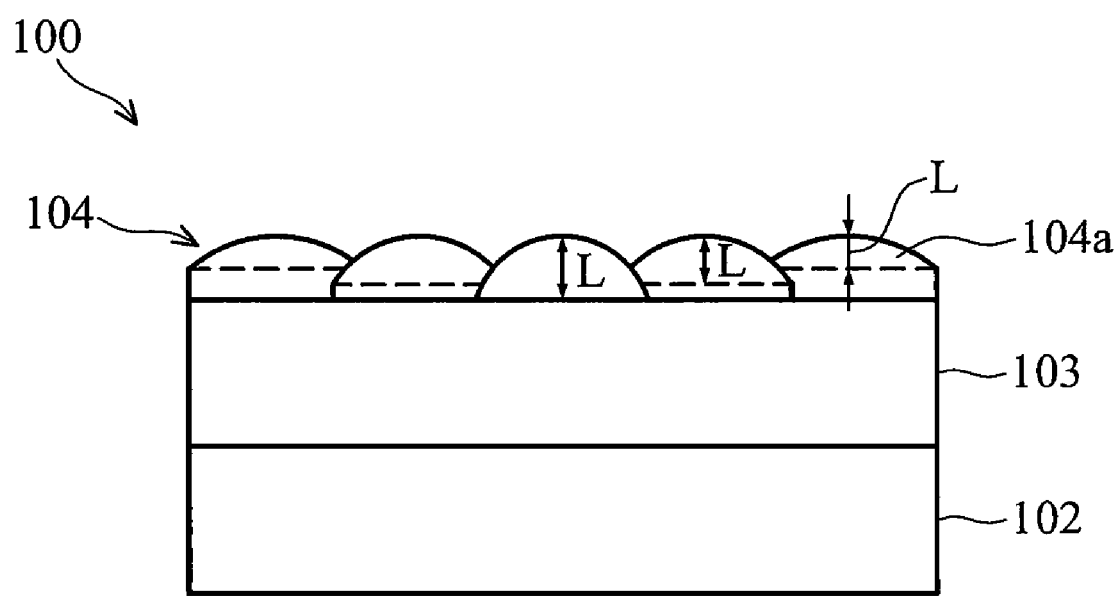
FIG. 6 is a cross section of the microlenses with different convex heights according to the invention.

In the embodiment, each microlens 104a is designed to shift with respect the corresponding pixel by a distance, except for the one corresponding to a central pixel of the pixel array 102 in order to compensate varied light intensities with chief ray angles (CRA), thereby reducing shading effect and cross-talk of pixels. Moreover, the microlenses 104a are designed to have different convex heights L at different chief ray angles (as shown in FIG. 6). The microlenses 104a with different convex heights L are used for compensating for the focal depth shift of the microlenses 104a at different chief ray angles.

Figure 2:
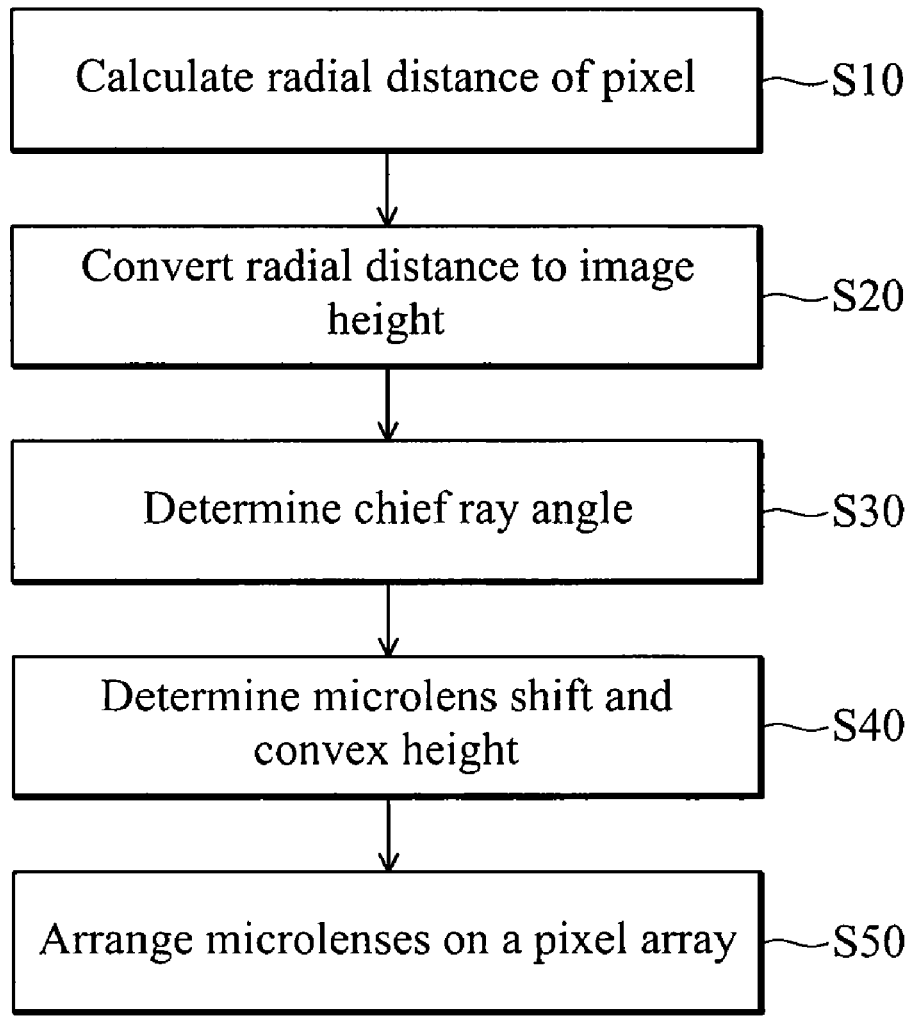
FIG. 2 is a flow chart showing an exemplary embodiment of a method for designing a microlens array on a pixel array according to the invention.
Figure 3:
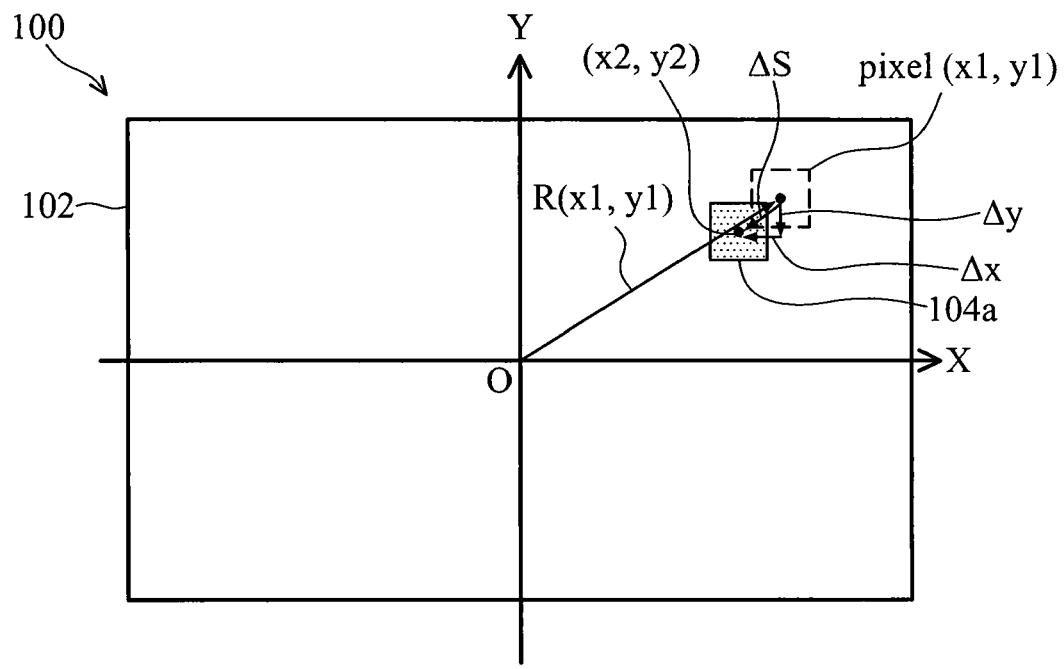
FIG. 3 is a plan view of a shifted microlens associated with the pixel array shown in FIG. 1.

Referring to FIG. 2, which is a flow chart showing an exemplary embodiment of a method for designing the microlens array 104 on the pixel array 102. In the initial step S10, a central pixel (not shown) in the pixel array 102 is used as an origin O of an X-Y coordinate, as shown in FIG. 3. Note that each point shown in the X-Y coordinate represents a microlens/pixel center and the origin O represents a central pixel center. In order to simplify the diagram, only a microlens 104 is depicted in FIG. 3. Next, a radial distance of each pixel from the central pixel (i.e. the origin O) in the pixel array 102 is calculated. For example, the dash region represents a pixel at a particular location and is denoted as pixel (x1, y1). The radial distance R(x1, y1) of the pixel (x1, y1) from the origin O is calculated. Next, in the step S20, the corresponding radial distance R(x1, y1) is converted to an image height. It is understood that the image height is zero if the pixel is located at the center of the pixel array 102, and the image height is 1 if the pixel is located at a diagonal edge from the center of the array 102 (assuming the pixel array is square).

Next, in the step S30, a chief ray angle of each pixel is determined according to the corresponding image height calculated in the step S20. Accordingly, the chief ray angle of the pixel (x1, y1) can be obtained. The relationship between the chief ray angle and the image height can be obtained by an optical characteristic of the image lens on the microlens array. Namely, a CRA versus image height curve is determined by the optical characteristic of the image lens 106 (as shown in FIG. 1) used for the microlens array 104.

Figure 4:
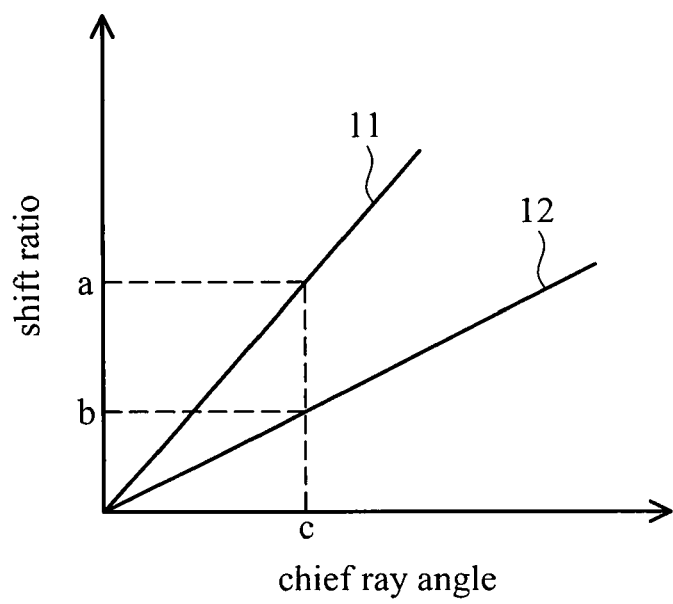
FIG. 4 is a graph of a relationship between a chief ray angle and shift ratio.

Next, in the step S40, a microlens shift with respect to the corresponding pixel is determined according to the corresponding chief ray angle. In the embodiment, each microlens shift combines an X-axis direction shift with a Y-axis direction shift. Moreover, an X-axis direction shift ratio is different from a Y-axis direction shift ratio. The term "X-axis direction shift ratio" as used herein, refers to a ratio of the X-axis direction shift to a distance between the shifted microlens and the origin along the X-axis direction. Also, the term "Y-axis direction shift ratio" as used herein, refers to a ratio of the Y-axis direction shift to a distance between the shifted microlens and the origin along the Y-axis direction. FIG. 4 illustrates a graph of a relationship between a chief ray angle and shift ratio, in which the curve 11 represents the X-axis direction shift ratio, and the curve 12 represents the Y-axis direction shift ratio.

For example, a microlens shift $\Delta S$ with respect to the corresponding pixel (x1, y1) is combined an X-axis direction shift $\Delta x$ with a Y-axis direction shift $\Delta y$, and the X-axis direction shift ratio (i.e. $\Delta x/x2$) is different from a Y-axis direction shift ratio (i.e. $\Delta y/y2$). In the embodiment, as the chief ray angle of the pixel (x1, y1) is equal to "c", the X-axis direction shift ratio is equal to "a" and the Y-axis direction shift ratio is equal to "b", where "a" is greater than "b", as shown in FIG. 4. Alternatively, in another embodiment, as the chief ray angle of the pixel (x1, y1) is equal to "c", the X-axis direction shift ratio may be less than the Y-axis direction shift ratio.

Figure 5B:
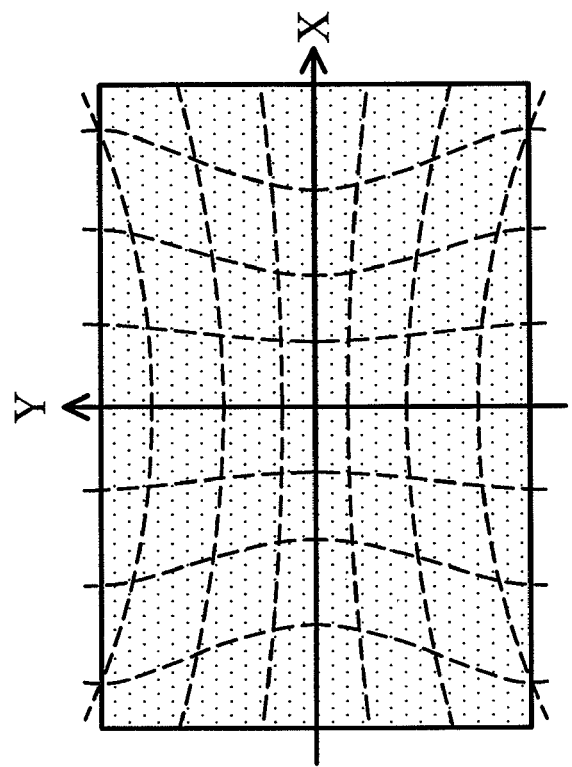
FIG. 5B is a plan view showing a distribution of shifted microlenses in a microlens array according to the invention.
Figure 5A:
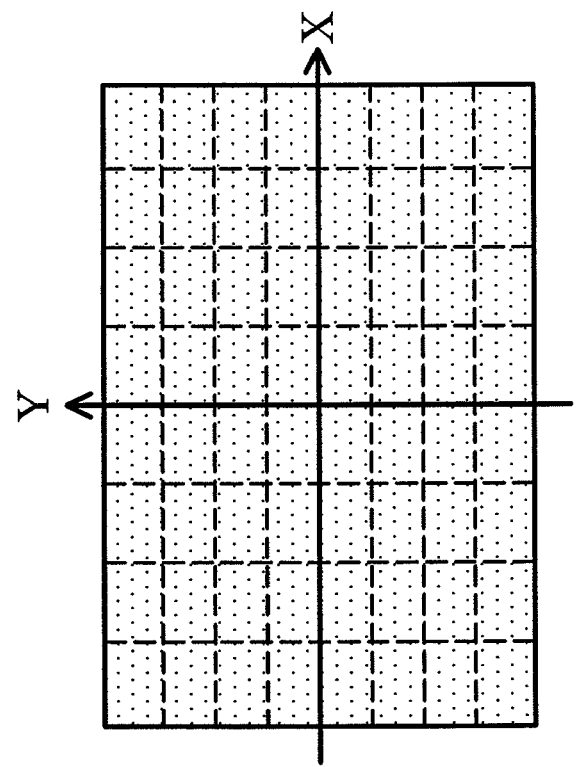
FIG. 5A is a plan view showing a distribution of non-shifted microlenses in a microlens array.

Referring to FIGS. 5A and 5B, in which FIG. 5A is a plan view showing a distribution of non-shifted microlenses in a microlens array and FIG. 5B is a plan view showing a distribution of shifted microlenses in a microlens array 104 according to the invention. Each dash line denotes a linking line of the centers of the microlenses in the microlens array 104 along the X-axis or Y-axis direction. Since the X-axis direction shift ratio is different from a Y-axis direction shift ratio, the distribution of shifted microlenses at the same chief ray angle is non-circularly symmetrical, as shown in FIG. 5B.

Also, in the step S40, a convex height of each microlens is determined according to the corresponding chief ray angle. Typically, the chief ray angle at the peripheral microlenses (i.e. at the region corresponding to the peripheral pixels of the pixel array) is larger than that at the central microlenses (i.e. at the region corresponding to the pixels near the central portion of the pixel array). Meanwhile, because the focal depth at the peripheral microlenses is shallower than that at the peripheral microlenses when each microlens has the same convex height, photosensitivity of the image sensor device is reduced because the light passing through the peripheral microlenses cannot be properly focused toward the corresponding photosensors. Accordingly, in the embodiment, the peripheral microlenses have a convex height lower than that of the central microlenses. Namely, the convex height is in inverse proportion to the chief ray angle. In the embodiment, the microlenses 104a have a convex height of about 0.4 μm to 0.8 μm, depending on the corresponding chief ray angle.

Finally, in the step S50, after determining the convex height of each microlens and the corresponding microlens shift, the microlenses 104a are arranged on the pixel array 102 to form a microlens array 104 thereon. FIG. 6 illustrates the microlenses 104a with different convex heights L, in which the microlenses 104a corresponding to the peripheral pixels of the pixel array 102 have a convex height L lower than that of the microlenses 104a corresponding to the pixels near the central portion of the pixel array 102. Moreover, the microlenses 104a overlap each other since each microlens 104 is shifted by a corresponding distance, except for the microlens corresponding to the central pixel.

According to the mentioned embodiments, since each microlens 104a is designed to shift with respect the corresponding pixel by a distance, shading effect and cross-talk of pixels can be reduced due to the compensation of the varied light intensities with chief ray angles. Namely, the signal to noise ratio of the image sensor device can be increased. Moreover, the microlens array 104 comprises microlenses 104a with a convex height that varies with the chief ray angle, and the incident light at different chief ray angles can be properly focused toward the corresponding photosensors, thereby increasing photosensitivity of the image sensor device of the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for designing a microlens array on a pixel array, comprising:
    calculating a radial distance of each pixel from a central pixel in a pixel array, wherein the central pixel acts as an origin of an X-Y coordinate;
    determining a chief ray angle of each pixel according to the corresponding radial distance;
    determining a microlens shift with respect to the corresponding pixel according to the corresponding chief ray angle; and
    arranging a plurality of microlenses according to the corresponding microlens shifts to form a microlens array on the pixel array,
    wherein each microlens shift includes an X-axis direction shift and/or a Y-axis direction shift, and an X-axis direction shift ratio is different from a Y-axis direction shift ratio for the microlens shift including the X-axis direction shift and the Y-axis direction shift, and
    wherein the X-axis direction shift ratio is a ratio of the X-axis direction shift to a distance between the shifted microlens and the origin along the X-axis direction, and the Y-axis direction shift ratio is a ratio of the Y-axis direction shift to a distance between the shifted microlens and the origin along the Y-axis direction.

2. The method for claim 1, wherein the X-axis direction shift ratio is greater than the Y-axis direction shift ratio.

3. The method for claim 1, wherein the chief ray angle is determined according to an image height obtained by performing a conversion the corresponding radial distance.

4. The method for claim 3, wherein the determination of the chief ray angle comprises obtaining a relationship between the chief ray angle and the image height by an optical characteristic of an image lens on the microlens array.

5. The method for claim 1, further comprising determining a convex height of each microlens according to the corresponding chief ray angle.

6. The method for claim 5, wherein the convex height is in inverse proportion to the chief ray angle.

7. The method for claim 5, wherein the convex height is in a range of about 0.4 μm to 0.8 μm.

8. An image sensor device, comprising:
    a pixel array having a plurality of pixels; and
    a microlens array having a plurality of microlenses correspondingly associated with the plurality of pixels, wherein each microlens is shifted with respect to the corresponding pixel by a distance determined by the method for claim 1 except for the microlens corresponding to a central pixel of the pixel array.

9. The device of claim 8, wherein the X-axis direction shift ratio is greater than the Y-axis direction shift ratio.

10. The device of claim 8, wherein each microlens has a convex height determined by the corresponding chief ray angle and the convex height is in inverse proportion with the chief ray angle.

11. The device of claim 10, wherein the convex height is in a range of about 0.4 μm to 0.8 m.

* * * * *